(12) United States Patent
Ponath et al.

(10) Patent No.: US 10,632,555 B2
(45) Date of Patent: Apr. 28, 2020

(54) ACTIVE BRAZING MATERIAL AND METHOD FOR ACTIVE BRAZING OF COMPONENTS

(71) Applicant: Endress + Hauser GmbH + Co. KG, Maulburg (DE)

(72) Inventors: Nils Ponath, Lorrach (DE); Andreas Rossberg, Bad Sackingen (DE); Elke Schmidt, Bad Sackingen (DE)

(73) Assignee: ENDRESS+HAUSER SE+CO. KG, Maulburg (DE)

( * ) Notice: Subject to any disclaimer, the term of this patent is extended or adjusted under 35 U.S.C. 154(b) by 158 days.

(21) Appl. No.: 15/535,080

(22) PCT Filed: Nov. 3, 2015

(86) PCT No.: PCT/EP2015/075561
§ 371 (c)(1),
(2) Date: Jun. 12, 2017

(87) PCT Pub. No.: WO2016/091482
PCT Pub. Date: Jun. 16, 2016

(65) Prior Publication Data
US 2017/0348783 A1    Dec. 7, 2017

(30) Foreign Application Priority Data
Dec. 11, 2014   (DE) .................. 10 2014 118 430

(51) Int. Cl.
*B23K 1/00* (2006.01)
*B23K 35/02* (2006.01)
(Continued)

(52) U.S. Cl.
CPC .......... *B23K 1/0006* (2013.01); *B23K 1/0016* (2013.01); *B23K 35/0238* (2013.01);
(Continued)

(58) Field of Classification Search
CPC ................................... B23K 1/0006
See application file for complete search history.

(56) References Cited

U.S. PATENT DOCUMENTS 5,023,147 A   6/1991  Nakata et al.
5,381,944 A   1/1995  Makowiecki et al.
(Continued)

FOREIGN PATENT DOCUMENTS

CN   103635997 A   3/2014
DE     3345219 C1   3/1985
(Continued)

OTHER PUBLICATIONS

Chinese Office Action in corresponding Chinese Application No. 201580068026.2, dated Oct. 9, 2018.
(Continued)

*Primary Examiner* — Erin B Saad
(74) *Attorney, Agent, or Firm* — Bacon & Thomas, PLLC

(57) ABSTRACT

An active brazing material for the energy-efficient production of active-brazed connections that consists of layer sequences arranged on top of one another, the layer sequences of which consist of layers arranged on top of on another, the layer sequences of which each comprise at least one layer of brazing material, wherein the layers of brazing material of each layer sequence each contain at least one component of a base active braze and, in conjunction with each other, contain all components of the base active braze, the layer sequences of which each comprise at least one first reaction layer consisting of a first reactant to which at least one second reaction layer is directly adjacent in the active brazing material and consists of a second reactant that exothermally reacts with the first reactant, wherein an enthalpy of formation of the exothermic reaction of the
(Continued)

reactants is greater than or equal to 45 kJ/mol—in particular, greater than or equal to 50 kJ/mol.

12 Claims, 1 Drawing Sheet

(51) Int. Cl.
  *B32B 15/01* (2006.01)
  *B23K 35/28* (2006.01)
  *B23K 35/30* (2006.01)
  *B23K 35/32* (2006.01)
  *C23C 14/18* (2006.01)
  *G01L 19/00* (2006.01)
  *B23K 103/00* (2006.01)

(52) U.S. Cl.
  CPC ........ *B23K 35/286* (2013.01); *B23K 35/3033* (2013.01); *B23K 35/32* (2013.01); *B23K 35/325* (2013.01); *B32B 15/01* (2013.01); *B32B 15/017* (2013.01); *C23C 14/18* (2013.01); *G01L 19/00* (2013.01); *B23K 2103/52* (2018.08)

(56) References Cited

U.S. PATENT DOCUMENTS

| | | | |
|---|---|---|---|
| 5,547,715 | A | 8/1996 | Barbee, Jr. et al. |
| 7,361,412 | B2* | 4/2008 | Wang ............... B23K 1/0006 428/686 |
| 2003/0164289 | A1* | 9/2003 | Weihs ............... B23K 1/0006 204/192.12 |
| 2005/0051607 | A1 | 3/2005 | Wang et al. |
| 2010/0038409 | A1 | 2/2010 | Widen et al. |
| 2012/0174681 | A1* | 7/2012 | Drewes ............... G01L 9/0075 73/724 |
| 2015/0110962 | A1* | 4/2015 | Gollerthan ......... B23K 35/0238 427/372.2 |

FOREIGN PATENT DOCUMENTS

| | | |
|---|---|---|
| DE | 102011008310 A1 | 10/2011 |
| DE | 102010043119 A1 | 5/2012 |
| DE | 102010063065 A1 | 6/2012 |
| DE | 102011005665 A1 | 9/2012 |
| DE | 102012110618 A1 | 5/2014 |
| DE | 102014118430 A1 | 6/2016 |
| EP | 0490807 A2 | 6/1992 |
| EP | 2662474 A1 | 11/2013 |

OTHER PUBLICATIONS

German Search Report, German Patent Office, Munich, DE, dated Oct. 9, 2015.
International Search Report, EPO, The Netherlands, dated Feb. 4, 2016.
English Translation of the International Preliminary Report on Patentability, WIPO, Geneva, CH—dated Nov. 3, 2015.
Karlo T. Raic; Rebeka Rudolf; Aleksandar Todorovic; Ivan Anzel; Association of Metallurigal Engineers of Serbia (AMES); Multilayered Nano-Foils for Low-Temperature Metal-Ceramic Joining; Designed by MACA 2008; vol. 14—2008; 14 pages.
Office Action dated Jun. 4, 2019, issued in corresponding Chinese Application No. 201580068026.2.

* cited by examiner

ACTIVE BRAZING MATERIAL AND METHOD FOR ACTIVE BRAZING OF COMPONENTS

TECHNICAL FIELD

The invention relates to an active brazing material for active brazing of components consisting of layer sequences arranged on top of one another of layers arranged on top of one another, as well as a method for active brazing of components that can be executed therewith.

BACKGROUND DISCUSSION

Active brazes and active brazing methods are used to join components.

An example of the application of this includes, for example, ceramic pressure sensors described in European patent, EP 490 807 A1 and German patent, DE 10 2010 043 119 A1, having
- a ceramic measurement membrane that can be supplied with pressure and elastically deformed as a function of the pressure,
- a ceramic base body, and
- an active-brazed connection that connects an outer edge of a first side of the measurement membrane including a pressure chamber to an outer edge of a face side of the base body facing the measurement membrane.

To active braze ceramic components, active brazes that have a thermal expansion coefficient that is as similar as possible to that of the ceramic are preferably used. The ternary active brazes described in EP 490 807 A1, which have a Zr—Ni alloy and titanium, are, in this respect, suitable for joining components made of aluminum oxide ceramics. During active brazing, the active component of the active braze—here, titanium—reacts with the ceramic. A mechanically high-strength chemical bond between the ceramic and the active braze is made by reducing the ceramic.

In EP 490 807 A1, an active-brazed connection made using a ring-shaped brazing preform is described, the height of which corresponds to the height of the pressure chamber included under the measurement membrane. Due to the melt-spinning method used to produce them, the brazing preforms described in EP 490 807 A1 have a minimum thickness on the order of 30 µm.

In capacitive ceramic pressure sensors that have at least one capacitor formed by an electrode applied to the measurement membrane and by a counter electrode applied to the face side of the base body facing the measurement membrane and having a capacity dependent upon the pressure-dependent deflection of the measurement membrane, the distance between the electrode and the counter electrode regularly depends upon the thickness of the measurement membrane and the active-brazed connection that bonds the base body.

A lower minimum thickness of the active-brazed connection that bonds the measurement membrane and the base body and, accordingly, lower electrode spacing that is better-suited to achieving higher measurement accuracy can be achieved according to a method described in DE 10 2010 043 119 A1. The active braze required for the active-brazed connection is applied to the joining surface via vapor deposition. In this way, joints having a lower structural height, e.g., with a thickness of 10 µm, can be produced.

Furthermore, an active brazing material is described in the as yet unpublished German patent application 10 2014 113858.5 of the applicant dated Sep. 26, 2014
- which consists of layer sequences arranged on top of one another,
- the layer sequences of which consist of layers of brazing material arranged on top of one another,
  - each of which consists of a component of a base active braze and, in conjunction with each other, contains all components of the base active braze, and
  - the quantity and layer thickness of which are coordinated with each other in such a way that the components of the base active braze are contained in the active brazing material in a quantity ratio that corresponds to the target composition of the base active braze.

In all three cases, the brazing is carried out by heating an arrangement as a whole formed by the base body, the brazing preform, and the measurement membrane to a brazing temperature above the melting point of the braze and keeping it there over an extended period of time—in particular, a period of time between 5 min and 15 min. In conjunction with the aforementioned ternary active brazes having a Zr—Ni alloy and titanium, temperatures above 800°C.—in particular, temperatures in the range of 890°C. to 920°C.—are regularly necessary for this purpose. Active brazing is thus a time- and energy-intensive process.

Because the components to be joined must, as a whole, be brought to this comparatively high temperature above the melting point of the active braze, it takes a correspondingly long amount of time for the joint to cool down after the brazing process. Long cooling times favor the formation of more coarse-grained structures within the joint, due to the precipitation of phases. This may cause inhomogeneities within the joint that impair the strength of the joint.

In U.S. Pat. No. 7,361,412 B2, brazing methods are described in which the heat energy required for the brazing is produced by reactive multilayer systems supplied as a film. Reactive multilayer systems comprise thin layers of reactants, alternately deposited on top of one another, that react with each other exothermally, such as nickel and aluminum. Triggered by local activation of the multilayer system, the reactants form inter-metallic phases. If the enthalpy of formation of the phase formation is high enough, the reaction heat released locally as a result of this causes the exothermic reaction to continue automatically along the multilayer system. This process becomes faster as the individual layers become thinner. Depending upon the thickness of the layers, propagation velocities on the order of 30 m/s are reached. The heat energy released in the process becomes greater as the multilayer system becomes thicker. Temperatures of over 1000°C. are reached. Because the heat energy is supplied only very briefly and very locally, the joint cools down very quickly again after the brazing process. Due to the faster cooling, joints are formed that are more fine-grained and more homogeneous, and thus have more strength.

The brazing methods described in U.S. Pat. No. 7,361,412 B2 all follow the same basic principle, according to which a reactive multilayer system is arranged between two components to be brazed, and at least one layer of brazing material is arranged on both sides of the multilayer system between the multilayer system and the respective component. Thus, an arrangement having the following stacking order is formed: component, braze, multilayer system, braze, and component. The two components are joined by pressurizing this arrangement at room temperature and triggering the reaction of the multilayer system. Multilayer systems having a thickness of 150 µm and more are required to provide the required amount of energy for brazing. As a result, the height of joints produced in this way is correspondingly high, such that these methods for joining the measurement membrane and base body of capacitive ceramic pressure sensors are regularly unsuitable.

SUMMARY OF THE INVENTION

It is an object of the invention to specify an active brazing material for producing active-brazed connections in an energy-efficient manner, as well as an active brazing method that can be carried out in an energy-efficient manner using this active brazing material.

For this purpose, the invention comprises an active brazing material,
which consists of layer sequences arranged on top of one another,
the layer sequences of which consist of layers arranged on top of one another,
the layer sequences of which each comprise at least one layer of brazing material, wherein the layers of brazing material of each layer sequence each contain at least one component of a base active braze and, in conjunction with each other, contain all components of the base active braze,
the layer sequences of which each comprise at least one first reaction layer consisting of a first reactant to which at least one second reaction layer is directly adjacent in the active brazing material and consists of a second reactant that exothermally reacts with the first reactant, wherein an enthalpy of formation of the exothermic reaction of the reactants is greater than or equal to 45 kJ/mol—in particular, greater than or equal to 50 kJ/mol.

A first embodiment is distinguished by the fact that the layers of the layer sequences have layer thicknesses on a nanometer scale—in particular, layer thicknesses less than or equal to 10 nm.

A second embodiment is distinguished by the fact that the first and second reaction layers have layer thicknesses on a nanometer scale—in particular, layer thicknesses less than or equal to 5 nm.

A third embodiment is distinguished by the fact that adjacent first and second reaction layers have comparable—in particular, equal—layer thicknesses.

A first variant of the invention provides that each layer sequence comprise a layer of brazing material
which consists of the base active braze and
on which a reactive layer system is arranged that comprises one of the first reaction layers and the directly adjacent second reaction layer.

A second variant of the invention provides that
at least one layer of brazing material consisting of the respective component be contained in each layer sequence for each component of the base active braze, and
a reactive layer system be arranged on at least one of these layers of brazing material that comprises one of the first reaction layers and the directly adjacent second reaction layer.

A fourth embodiment is distinguished by the fact that
the first reaction layers consist of a first reactant that reacts exothermally with a component of the base active braze,
an enthalpy of formation of the exothermic reaction of the first reactant with this component is greater than or equal to 45 kJ/mol—in particular, greater than or equal to 50 kJ/mol—and
the second reaction layers are layers of brazing material that consist of this component.

A further development of the fourth development provides that at least one of the layers of brazing material consisting of the component that reacts exothermally with the first reactant is arranged in each layer sequence such that it is arranged in the active brazing material between two first reaction layers consisting of the first reactant.

A preferred configuration of the second variant, the fourth development, or the further development of the fourth development provides that the layers of brazing material have a layer thickness of less than or equal to 10 nm—in particular, less than or equal to 5 nm.

A preferred configuration of the fourth development provides that
the base active braze have the components zirconium, nickel, and titanium, and
the first reaction layers consist of aluminum, and
the second reaction layers be layers of brazing material made of nickel.

The invention also comprises a method for producing an active brazing material according to the invention in which the individual layers are applied to one another by consecutive vapor deposition—in particular, consecutive sputtering operations.

The invention also comprises a method for active brazing of components using an active brazing material according to the invention in which
an arrangement is produced in which the active brazing material is arranged between joining surfaces of the components to be joined, and
the exothermic reactions of the first reaction layer and the second reaction layer adjacent to it are triggered during the active brazing.

A development of the latter method provides that the exothermic reactions are triggered at a base temperature of the arrangement at which the energy produced by the exothermic reactions is enough to melt the layers of the active brazing material.

A further development of the latter method or its further development provides that
the active brazing material be arranged between the joining surfaces in the form of a prefabricated molded part—in particular, a film,
the active brazing material be applied to one of the joining surfaces—in particular, by consecutive vapor deposition of its layers to be arranged on top of one another—or
one portion of the active brazing material be applied to each of the joining surfaces—in particular, by consecutive vapor deposition of its layers to be arranged on top of one another.

The invention also comprises a ceramic pressure sensor having
a measurement membrane that can be supplied with pressure and elastically deformed as a function of the pressure—in particular, a ceramic measurement membrane, particularly of aluminum oxide,
a base body—in particular, a ceramic base body, particularly of aluminum oxide, and
an active-brazed connection that bonds an outer edge of a first side of the measurement membrane including a pressure chamber to an outer edge of a face side of the base body facing the measurement membrane and is produced using an active brazing material according to the invention—in particular, an active brazing material, the base active braze of which has the components zirconium, nickel, and titanium.

The active brazing material according to the invention has the advantage that the plurality of reaction layers that react with each other exothermally, which are arranged to be distributed over the entire height of the active brazing material, supply energy within a short period of time during active brazing carried out therewith that is available for melting the components of the base active braze. It is advantageous that the components are present in the form of layers of brazing material that are very thin compared to the layer thickness of the active brazing material and heated very quickly by the heat energy released in the exothermic reactions. Accordingly, due to the exothermally reacting reaction layers, significantly less time and energy is required for the active brazing than is the case with active-brazed connections that are currently used to produce pressure sensors and are achieved exclusively by heating the components to be joined and the active-brazed connections arranged between the components.

This offers the advantage that the components to be joined, for the purpose of active brazing, no longer need to be heated as a whole above the melting point of the base active braze. Accordingly, the active-brazed connection cools down faster after the brazing process. As a result of this, the formation of more coarse-grained structures within the joint is reduced drastically, such that joints are formed that are more fine-grained and thus, inevitably, more homogeneous, and thereby have more strength.

Another advantage of the inventions is that active-brazed connections having a comparatively lower height—in particular, having heights greater than or equal to 4 µm—can be produced.

BRIEF DESCRIPTION OF THE DRAWINGS

The invention and its advantages will now be explained in detail in reference to the figures in the drawing, which show three exemplary embodiments. Identical elements are given the same reference characters in the figures.

DETAILED DISCUSSION IN CONJUNCTION WITH THE DRAWINGS

The starting point of the active brazing material according to the invention is a base active braze having the components $K_1, \ldots, K_n$. For this purpose, active brazes known from the prior art can be used, such as the active braze mentioned at the outset having the components zirconium, nickel, and titanium.

The active brazing material according to the invention consists of a plurality of layer sequences SF arranged on top of one another, each of which consists of a sequence of thin layers arranged on top of one another.

The layers of each layer sequence SF comprise layers of brazing material L that each contain at least one component $K_i$ of the base active braze and are prescribed such that all components $K_1, \ldots, K_n$ of the base active braze are contained in each layer sequence SF. The quantity, layer thickness, and composition of the layers of brazing material L are coordinated with each layer sequence SF in such a way that the components $K_1, \ldots, K_n$ of the base active braze AHL are contained in each layer sequence SF in a ratio that corresponds to a target composition of the active brazing material.

The components $K_1, \ldots, K_n$ of the base active braze AHL can be provided within the layer sequences SF in different ways.

Figure 1:
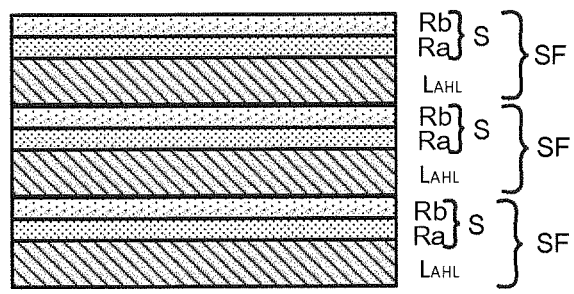
FIG. 1 shows: an example of three layer sequences of an active brazing material, each of which has a layer of brazing material consisting of a base active braze, on which a reactive layer system is arranged.

According to a first variant of the invention, only such layers of brazing material $L_{AHL}$ are used as consist of the base active braze AHL, e.g., the aforementioned Zr—Ni—Ti base active braze. In this variant, at least one layer of brazing material $L_{AHL}$ consisting of the base active braze AHL is provided in each layer sequence SF. An exemplary embodiment of this is shown in FIG. 1, where three layer sequences SF of the active brazing material are shown by way of example.

Figure 2:
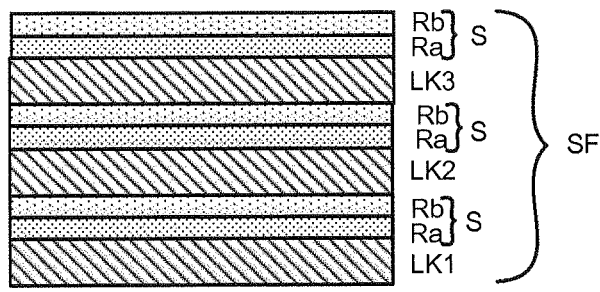
FIG. 2 shows: a layer sequence of an active brazing material having three layers of brazing material, each consisting of one other component of the base active braze, on each of which a reactive layer system is arranged.
Figure 3:
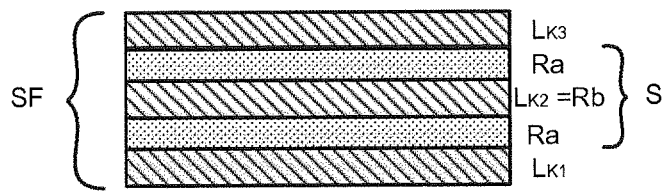
FIG. 3 shows: a layer sequence of an active brazing material having three layers of brazing material, each consisting of a component of the base active braze, of which one is arranged between two reaction layers with which it reacts exothermally.

According to a second variant, each layer sequence SF has, for each of the components $K_i$ of the base active braze AHL, at least one layer of brazing material $L_{Ki}$ consisting exclusively of the respective component $K_i$. Exemplary embodiments of this are shown in FIGS. 2 and 3, where, in each case, a single layer sequence SF of the respective active brazing material is shown by way of example. Both exemplary embodiments are based upon a base active braze AHL consisting of three components K1, K2, and K3, such as the aforementioned Zr—Ni—Ti base active braze. The layer sequences SF shown each have, for each of the components K1, K2 and K3, exactly one layer of brazing material $L_{K1}$, $L_{K2}$, $L_{K3}$ consisting of the respective components K1, K2, and K3. To achieve a desired composition of the active brazing material, it is possible to deviate from this—for example, by providing, for individual components $K_i$, two or more layers of brazing material $L_{Ki}$ consisting of these components.

Of course, combined forms can also, alternatively, be used, in which layers of brazing material L are provided, each of which contains at least one component $K_i$ of the base active braze AHL, and, in combination with each other, cover all components $K_1, \ldots, K_n$ of the base active braze AHL.

According to the invention, at least one first reaction layer Ra, which consists of a reactant, that reacts exothermally with at least one other reactant, is provided in each layer sequence SF. In addition, each layer sequence SF comprises at least one second reaction layer Rb that consists of one of these other reactants. The first and second reaction layers Ra, Rb are arranged in the layer sequences SF in such a way that, within the active brazing material, to each first reaction layer Ra, at least one therewith exothermally reacting second reaction layer Rb is adjacent.

In conjunction with the adjacent second reaction layer(s) Rb, the first reaction layers Ra form energy accumulators integrated in the active brazing material, the energy of which is released by triggering the exothermic reaction of the reaction layers Ra, Rb adjacent to one another during an active brazing carried out with the active brazing material.

The first and second reaction layers Ra, Rb are designed as thin layers and preferably have a layer thickness on a nanometer scale. The layer thicknesses of the reaction layers Ra, Rb are preferably less than or equal to 5 nm, e.g., 2 nm.

In addition, adjacent reaction layers Ra, Rb preferably have comparable thicknesses—preferably, the same thickness.

In principle, reactant combinations of reactants, which react with each other exothermally and are also used in reactive multilayer systems known from the prior art, can be used. While reactive multilayer systems consist exclusively of reaction layers that are arranged on top of one another and react with each other exothermally, the reaction layers Ra, Rb adjacent to one another of the active brazing materials according to the invention form only a partial component thereof. To account for this, a reactant combination is provided for the first and second reaction layers Ra, Rb, the enthalpy of formation of which is greater than or equal to a minimum enthalpy of 45 kJ/mol, and, preferably, even greater than or equal to 50 kJ/mol. In this respect, suitable reactant combinations include, in particular, aluminum combined with nickel, which has enthalpy of formation of over 50 kJ/mol, and, with a mixing ratio of 1:1, even over 60 kJ/mol.

In contrast, reactant combinations like zirconium or titanium combined with nickel have, with a mixing ratio of 1:1, enthalpy of formation in the range of only 42 kJ/mol, and the enthalpy of formation of zirconium combined with titanium is even lower.

In conjunction with the first variant of the invention shown in FIG. 1, in which layers of brazing material $L_{AHL}$ consisting exclusively of the base active braze AHL are used, the layer sequences SF each comprise a layer of brazing material $L_{AHL}$ on which a reactive layer system S is arranged that has at least one first reaction layer Ra on and/or below which an adjacent second reaction layer Rb is arranged. In conjunction with the aforementioned Zr—Ni—Ti base active braze, reaction layers Ra, Rb made of aluminum and nickel are, in particular, suitable for this purpose.

In the event that, in conjunction with the chosen base active braze AHL, first reaction layers can be found that react exothermally to a sufficient degree with layers of brazing material made of the base active braze AHL, layer sequences, each of which comprises a layer of brazing material $L_{AHL}$ consisting of the base active braze AHL, can also, alternatively, be formed, on and/or below which one of these first reaction layers Ra is arranged. In this case, the layer of brazing material $L_{AHL}$ consisting of the base active braze AHL simultaneously serves as a second reaction layer.

In conjunction with the second variant, layer sequences SF can also analogously be formed in which a reactive layer system S is arranged on at least one of the layers of brazing material $L_{Ki}$ contained in the layer sequence SF. The reactive layer system S comprises at least one first reaction layer Ra, on the upper and/or lower side of which a second reaction layer Rb is arranged that reacts exothermally therewith. In the exemplary embodiment shown in FIG. 2, a reactive layer system S comprising a first reaction layer Ra and a second reaction layer Rb arranged thereon is provided on each of the three layers of brazing material LK1, LK2, LK3 as a possible example.

Preferably, the first reaction layers Ra of the active brazing materials according to the invention consist of a first reactant that reacts exothermally to a sufficient extent with at least one component $K_{Rb}$ of the base active braze AHL. This offers the advantage that layers of brazing material $L_{KRb}$ consisting of these components $K_{Rb}$ can be used as second reaction layers Rb. As a result, the portion of components that are contained in the active brazing material and not in the base active braze is reduced.

In conjunction with the base active braze AHL mentioned at the outset having the components zirconium, nickel, and titanium, the first reaction layers Ra are preferably made of aluminum for this purpose. Aluminum offers the advantage that it reacts exothermally with the nickel contained in the base active braze AHL to a large extent, and also reacts exothermally with the zirconium contained in the base active braze AHL to a lesser extent.

The following layer sequences SF, for example, can thus be used in the exemplary embodiment shown in FIG. 1:
a) . . . (Zr—Ni—Ti—Al—Ni)—(Zr—Ni—Ti—Al—Ni)—(Zr—Ni—Ti—Al—Ni) . . .
b) . . . (Zr—Ni—Ti—Ni—Al)—(Zr—Ni—Ti—Ni—Al)—(Zr—Ni—Ti—Ni—Al) . . .

wherein the Zr—Ni—TI layers each form the layer of brazing material $L_{AHL}$ from the base active braze, the aluminum layers form the first reaction layers Ra, and the nickel layers form layers of brazing material $L_{Ni}$ used as second reaction layers Rb.

In the same way, it is also, of course, possible in the exemplary embodiment shown in FIG. 2 for each second reaction layer Rb to be a layer of brazing material $L_{KR}$ made of one of the components $K_R$ of the base active braze that react exothermally with the first reactant of the first reaction layer Ra.

In conjunction with the second variant of the invention, in which each layer sequence SF comprises at least one layer of brazing material $L_{K1}, \ldots, L_{Kn}$ consisting exclusively of the respective components $K_1, \ldots, K_n$ for all components $K_i$ of the base active braze AHL in any case, a layer sequence SF is, however, preferably selected, in which the first reaction layer Ra, which reacts exothermally with the layers of brazing material $L_{Ki}=L_{KR}$ comprising a component $K_R$ that reacts exothermally with a first reaction layer Ra, is provided on the upper and/or lower side of at least one of the layers of brazing material.

As an example thereof, FIG. 3 shows a layer sequence SF that has three different layers of brazing material L1, L2, L3, each of which consists of a component K1, K2, K3 of the base active braze AHL, and of which the layer of brazing material L2 serves as a second reaction layer Rb that reacts exothermally with the first reaction layers Ra that are arranged above it and below it and are directly adjacent to it. In conjunction with the base active braze having the components zirconium, nickel, and titanium, the layer sequence SF shown in FIG. 3 can consist of, for example, the layers arranged on top of one another of
a) Zr—Al—Ni—Al—Ti,
b) Zr—Al—Ti—Al—Ni, or
c) Ni—Al—Zr—Al—Ti.

Other possible layer sequences SF can, for example, be obtained, if one of the two aluminum layers contained in example sequence a) is omitted, or if the aluminum layer arranged between the zirconium layer and the titanium layer in example sequences b) and c) is omitted.

Should there be base active brazes which have two components that react with each other exothermally, during the exothermic reaction of which an enthalpy of formation is released that is greater than or equal to the minimum enthalpy of 45 kJ/mol, the first and second reaction layers are preferably formed by layers of brazing material formed of the components that correspondingly react with each other exothermally. In this case, materials that are not contained in the base active braze can be dispensed with entirely in the active brazing material.

The active brazing material according to the invention is preferably produced by applying the individual layers of the material to each other by consecutive vapor deposition.

Each layer sequence SF is produced by a sequence of consecutive vapor deposition processes in which the individual layers of the layer sequence SF are deposited on each other. This sequence is repeated until the active brazing material having this composition has a desired material thickness that is provided by the sum of the layer thicknesses of the layers applied to each other as a whole.

A desired target composition of the active brazing material is prescribed via the composition, the quantity, and the layer thicknesses of the individual layers of the layer sequences SF. However, all layers preferably have a layer thickness lesser than or equal to 10 nm. The layer thicknesses of layers that serve exclusively as a layer of brazing material can be varied within this layer thickness range to achieve the desired target composition. If at least individual components $K_1, \ldots, K_n$ of the base active braze AHL are provided in the active brazing material in separate layers of brazing material L, the layers of brazing material $L_{Ki}$, $L_{KR}$ preferably have a layer thickness of less than or equal to 5 nm, so as to accelerate thorough mixing of the components $K_1, \ldots, K_n$ of the base active braze AHL provided in the various layers of brazing material L during active brazing at temperatures below the melting point of the respective components $K_1, \ldots, K_n$.

However, layers that are used exclusively, or at least also, as a reaction layer Ra, Rb preferably have layer thicknesses less than or equal to 5 nm, e.g., 2 nm, wherein the layer thicknesses of first and second reaction layers Ra, Rb adjacent to one another are preferably identical.

Assuming an average layer thickness in the range of 5 nm, an active brazing material having a material thickness of 5 µm consists of approximately 1000 layers applied to each other. For layer sequences having less than 10 layers, this corresponds to more than 100 layer sequences.

The vapor deposition can be done via, for example, sputtering. The material of the respective layer to be applied is provided by a sputtering target consisting of this material, which is then sputtered on in a sputtering process. For the production of layers consisting of only a single chemical element, pure targets are used that exclusively contain the respective element. The layers of brazing material $L_{Ki}$ consisting of only one of the components $K_i$ of the base active braze AHL, as well as the reaction layers Ra, Rb consisting of the first or second reactant, can thus be produced. For the production of layers having several chemical elements, corresponding mixing targets are used that contain the chemical elements in the desired composition. The layers of brazing material $L_{AHL}$ consisting of the base active braze AHL can be produced using such mixing targets. Mixing targets having a composition corresponding to a base active braze are described in, for example, DE 10 2010 043 119 A1, which was mentioned above, and can be produced via, for example, powder metallurgy. Because base active brazes have an active component, the comminution and grinding processes required for the production of the mixing targets are carried out in a hydrogen atmosphere.

As an alternative to this, a method described in German Patent Application no. 10 2014 116761.9 of the applicant, filed on Nov. 17, 2014 and not yet published, can be used to produce layers having a plurality of components. In this method, an intermediate target is coated by sputtering the individual components and is then used as a target for producing the layers of active brazing material having these components. The coating of the intermediate target can be done serially by sequential deposition of thin layers of the individual components on each other by sputtering, wherein the layers have a thickness of less than or equal to 10 nm, and, preferably, less than or equal to 1 nm. The proportionate composition of the intermediate target of the components is adjusted via the quantities and layer thicknesses of the individual layers. Alternatively, the individual components can be deposited synchronously by sputtering on the intermediate target. In this case, the proportionate composition of the intermediate target of the components is, for example, controlled via a potential difference between a noble gas source and the individual sputtering targets that each contain one of the components.

The layer thickness in which the individual layers of the active brazing material are applied is controlled during sputtering via the electrical power and the sputtering time. In order to achieve an efficient deposition rate along with sufficiently good control of the rate, a sputtering system with a high-power magnetron is preferably used. This makes it possible to set deposition rates between approximately 0.2 nm/s and approximately 2 nm/s in a controlled manner.

Figure 4:
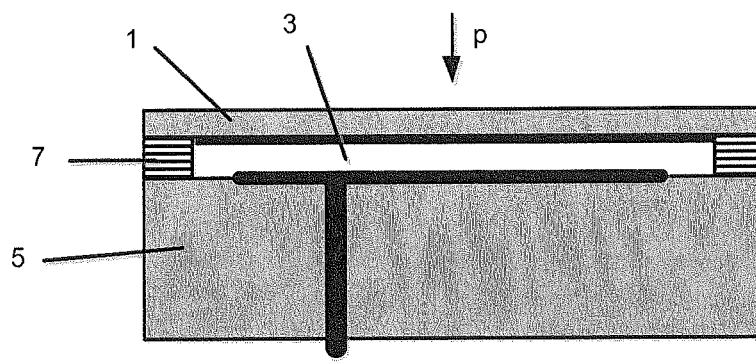
FIG. 4 shows: a ceramic pressure sensor having an active-brazed connection according to the invention.

FIG. 4 shows an exemplary embodiment of two components that are bonded to each other via an active brazing method according to the invention carried out using the active brazing material according to the invention. The components include a measurement membrane 1 that can be supplied with a pressure p, is elastically deformed as a function of the pressure, and is arranged on a base body 5 including a pressure chamber 3. For this purpose, an outer edge of the side of the measurement membrane 1 facing the base body 5 is bonded to an outer edge of a face side of the base body 5 facing the measurement membrane 1 by an active-brazed connection 7 according to the invention. Measurement membrane 1 and base body 5 are made of ceramic—for example, of aluminum oxide ($Al_2O_3$).

According to the active brazing method according to the invention, an arrangement is first produced in which the active brazing material according to the invention is arranged between the joining surfaces of the two components to be joined—in this case, the measurement membrane 1 and the base body 5. For this purpose, the active brazing material can be arranged between the joining surfaces in the form of a prefabricated molded part—in particular, a film. Alternatively, the active brazing material can be applied to one of the two joining surfaces by applying the layers thereof to each other, using a mask to cover the surfaces that are not to be coated, by consecutive vapor deposition. Of course, a portion of the active brazing material can also be applied to each of the joining surfaces by the layers of the layer sequences SF of the respective portion being applied to each other there by consecutive vapor deposition.

After the active brazing material has been introduced or applied, the arrangement is active-brazed in a vacuum or in a protective gas atmosphere. In the process, the reactive layer systems S formed by the first and the respectively adjacent second reaction layers Ra, Rb of the layer sequences SF are caused to react. These reactions can, for example, be triggered electrically, thermally, electromagnetically, or via laser pulses.

Of course, the energy released as a result increases as the number of layer systems increases and as the enthalpy of formation of the reactants reacting with each other increases. If the total energy released by the reaction is already enough to melt the layers of the active brazing material, triggering the reactions is already enough to effect the active-brazed connection.

Otherwise, the arrangement is heated, prior to the initiation of the reactions, to a prescribed base temperature as a function of the energy released during the exothermic reactions of the first and second reaction layers Ra, Rb and the melting points of the layers of brazing material L. The base temperature is to be set such that the energy additionally supplied by the exothermic reactions is sufficient to melt the layers of brazing material that have already been heated to the base temperature. Because the components $K_i$ of the base active braze are present in the form of layers of brazing material L that are very thin compared to the layer thicknesses of the active brazing material and heat up very quickly due to the heat energy released by the exothermic reactions, the active-brazed connection can also be carried out in a significantly shorter time than is possible in the case of active-brazed connections carried out with the pure base active braze. On account of the energy available via the exothermic reactions, the base temperature is clearly below the melting point of the base active braze. Because, contrary to the active-brazed connections carried out with the base active braze, the arrangement no longer needs to be heated to a brazing temperature above the melting point of the base active braze as a whole, the active-brazed connections according to the invention can be carried out in a significantly more energy-efficient manner. Furthermore, the active-brazed connection cools down significantly more rapidly, such that more finely-grained, more homogeneous, and thus higher strength joints are formed.

The invention claimed is:

1. A method for active brazing of components of a ceramic pressure sensor, said pressure sensor comprising:
   a ceramic measurement membrane that can be supplied with pressure and elastically deformed as a function of the pressure; and
   a ceramic base body;
   the method comprising:
   producing an active-brazed connection during the active brazing, wherein said active-brazed connection bonds an outer edge of a first side of said measurement membrane to an outer edge of a face side of said base body facing the measurement membrane, thereby including a pressure chamber of said ceramic pressure sensor;
   using an active brazing material in the production of said active-brazed connection, said active brazing material comprising:
   layer sequences arranged on top of one another, said layer sequences consist of layers arranged on top of one another; wherein:
   said layer sequences each comprise at least one layer of said active brazing material, the layers of said active brazing material of each layer sequence each contain at least one component of a base active braze, and the layers in conjunction with each other, contain all components of said base active braze; and
   said layer sequences of which each comprise at least one first reaction layer consisting of a first reactant to which at least one second reaction layer is directly adjacent in said active brazing material and consists of a second reactant that exothermally reacts with said first reactant, an enthalpy of formation of the exothermic reaction of the reactants is greater than or equal to 45 kJ/mol;
   wherein the second reactant is a component of said base active braze, said second reaction layers are layers of said brazing material that consist of said respective component,
   wherein said base active braze comprises zirconium, nickel, and titanium; said first reaction layers consist of aluminum; and said second reaction layers are layers of brazing material made of nickel,
   producing an arrangement in which said active brazing material is arranged between joining surfaces of said ceramic base body and said ceramic measurement membrane; and
   triggering the exothermic reactions of said first reaction layer and said second reaction layer adjacent to it during the active brazing.

2. The method according to claim 1, wherein:
   said layers of said layer sequences have layer thicknesses less than or equal to 10 nm.

3. The method according to claim 1, wherein:
   said first reaction layers and said second reaction layers have layer thicknesses less than or equal to 5 nm.

4. The method according to claim 1, wherein:
   said first reaction layers and said second reaction layers adjacent to one another have equal layer thicknesses.

5. The method according to claim 1, wherein:
   each layer sequence comprises a layer of said brazing material, which consists of said base active braze and on which a reactive layer system is arranged that comprises one of said first reaction layers and said directly adjacent second reaction layer.

6. The method according to claim 1, wherein:
   at least one layer of said brazing material consisting of said at least one component of said active braze is contained in each layer sequence for each component of said base active braze; and
   a reactive layer system is arranged on at least one of these layers of brazing material that comprises one of said first reaction layers and said directly adjacent second reaction layer.

7. The method according to claim 1, wherein:
   at least one of said layers of brazing material consisting of said respective component that reacts exothermally with said first reactant is arranged in each layer sequence in such a manner that it is arranged in said active brazing material between two of said first reaction layers consisting of said first reactant.

8. The method according to claim 6, wherein:
   said layers of said brazing material have a layer thickness of less than or equal to 10 nm.

9. The method according to claim 1, wherein:
   the exothermic reactions are triggered at a base temperature of said arrangement at which the energy produced by the exothermic reactions is enough to melt the layers of said active brazing material.

10. The method for active brazing of components according to claim 1, wherein:
    active brazing material is arranged between joining surfaces in the form of a prefabricated molded part;
    or said the active brazing material is applied to one of the joining surfaces; or
    one portion of the active brazing material is applied to each of the joining surfaces.

11. The method according to claim 10, wherein said prefabricated molded part is a film,
    or wherein said active brazing material is applied by consecutive vapor deposition of its layers to be arranged on top of one another.

12. The method according to claim 1, wherein said ceramic measurement membrane is made of aluminum oxide (Al2O3) and said ceramic base body is made of aluminum oxide (Al2O3).

* * * * *